US008068185B2

(12) United States Patent
Chen

(10) Patent No.: US 8,068,185 B2
(45) Date of Patent: Nov. 29, 2011

(54) VOLUME ADJUSTING METHOD FOR CHANNEL SWITCHING OF DIGITAL TELEVISION

(75) Inventor: Yue-Yong Chen, Taipei (TW)

(73) Assignee: ALI Corporation, Taipei (TW)

( * ) Notice: Subject to any disclaimer, the term of this patent is extended or adjusted under 35 U.S.C. 154(b) by 556 days.

(21) Appl. No.: 12/364,522

(22) Filed: Feb. 3, 2009

(65) Prior Publication Data

US 2010/0195002 A1 Aug. 5, 2010

(51) Int. Cl.
*H04N 5/60* (2006.01)
(52) U.S. Cl. ........................................ 348/738
(58) Field of Classification Search .................. 348/738, 348/725, 734, 552, 553; 381/94.5, 57
See application file for complete search history.

(56) References Cited

U.S. PATENT DOCUMENTS

| 5,172,358 | A | * | 12/1992 | Kimura | 369/47.26 |
| 5,268,964 | A | * | 12/1993 | Watts | 381/107 |
| 5,363,147 | A | * | 11/1994 | Joseph et al. | 348/738 |
| 5,369,440 | A | * | 11/1994 | Sussman | 725/28 |
| 5,434,926 | A | * | 7/1995 | Watanabe et al. | 381/108 |
| 5,444,783 | A | * | 8/1995 | Na | 381/57 |
| 5,631,714 | A | * | 5/1997 | Saadoun | 348/738 |
| 5,778,077 | A | * | 7/1998 | Davidson | 381/57 |
| 6,188,439 | B1 | * | 2/2001 | Kim | 348/553 |
| 6,552,753 | B1 | * | 4/2003 | Zhurbinskiy et al. | 348/738 |
| 7,369,185 | B2 | * | 5/2008 | Kitamura | 348/738 |
| 2004/0146167 | A1 | | 7/2004 | Bennett | |
| 2006/0018493 | A1 | | 1/2006 | Oh et al. | |
| 2008/0273719 | A1 | | 11/2008 | Chen | |

FOREIGN PATENT DOCUMENTS

| EP | 1 681 765 A2 | 7/2006 |
| EP | 1 681 765 A3 | 1/2007 |
| WO | 9917442 A1 | 4/1999 |

* cited by examiner

*Primary Examiner* — Paulos Natnael
(74) *Attorney, Agent, or Firm* — Winston Hsu; Scott Margo

(57) ABSTRACT

While a user of a digital television gives a command to switch from a first channel to a second channel, a comparison between a first remembered volume of the first channel and a second remembered volume of the second channel is provided. According to the result of the comparison, a currently-used volume of the second channel may be adjusted from the first remembered volume to the second remembered volume iteratively and by step volumes so that the adjustment of the currently-used volume of the later channel is not annoying for the user. Moreover, the user is also allowed in determining a preferred volume to be the currently-used volume of the second channel. While the user of the digital television flips between channels, unnecessary updates in a volume setting of the second channel are abandoned.

7 Claims, 4 Drawing Sheets

VOLUME ADJUSTING METHOD FOR CHANNEL SWITCHING OF DIGITAL TELEVISION

BACKGROUND OF THE INVENTION

1. Field of the Invention

The present invention relates to a volume adjusting method, and more particularly, to a volume adjusting method for channel switching of a digital television.

2. Description of the Prior Art

In families, a television may provide people with entertainments. For better entertainments, visual qualities and audio qualities of televisions are getting important, as well as interactions with the televisions. Digital televisions are designed for providing better visual qualities and audio qualities in entertainments, and therefore, visual and audio requirements of digital televisions are highly regulated as well.

A digital television is often switched to play programs of different channels, each of which uses different levels of remembered volumes, a receiver of the digital television, which may also be called as a digital television receiver and be implemented within a set top box, may record a used volume for each channel played by the digital television, where the recorded volume is used at a last time when the user switches the digital television to each the channel. Volumes of other portable devices, such as a portable television or a personal digital assistant capable of playing programs of various channels, may also be recorded according to the various channels received by the portable devices with the aid of similar receivers.

However, a same digital television may be used by different people so that the digital television has to follow different volumes in the volume setting for each the channel played by the digital television, and therefore, some defects may arise. For example, when a user of the digital television switches from a first channel, which uses a significantly low remembered volume, to a second channel, which uses a significantly high remembered volume, the user may be frightened by a huge volume difference from the significantly low remembered volume to the significantly high remembered volume.

In US Patent Application No. 20060018493, an apparatus and method is disclosed for compensating volume in response to a channel change. In the related disclosure, disclosed characteristics include generating a gain to adjust a level of an input audio signal by comparing an average level of the input audio signal with a predetermined input/output curve, adjusting a volume of the input audio signal by applying the generated gain to the level of the input audio signal, and adjusting a dynamic range of the audio signal having the adjusted volume. However, according to the disclosed application, when the new channel plays soft voices, which indicate a significantly low volume, or explosion of bombs, which indicate a significantly high volume, at the time when the user of the digital television switches to the new channel, the generated gain may be deviated from succeeding volumes of the new channel so as to bring unexpected peaks or foots in volume. Moreover, if the gain is adjusted continuously for matching the succeeding volumes of the new channel, played volumes of the digital television are not stable also as a price so that audio qualities of playing programs of the new channel are significantly reduced. As can be inducted, continuously adjusting the played volume of the new channel on the digital television may not be feasible because of the price of affecting the audio qualities of the digital television.

SUMMARY OF THE INVENTION

The claimed invention discloses a volume adjusting method for channel switching of a digital television. The method comprises comparing a first remembered volume used for a first channel with a second remembered volume used for a second channel, while a digital television receives a first command for switching from the first channel to the second channel; the digital television using the first remembered volume in advance to play a first program of the second channel, while the first remembered volume is not equal to the second remembered volume; adjusting a currently-used volume of the digital television from the first remembered volume to the second remembered volume iteratively and step volume by step volume for generating a plurality of volumes; and comparing the generated plurality of volumes with the second remembered volume one by one. The second remembered volume is a volume used at a last time when the digital television plays a second program of the second channel. The second remembered volume is recorded in a volume setting of the second channel.

These and other objectives of the present invention will no doubt become obvious to those of ordinary skill in the art after reading the following detailed description of the preferred embodiment that is illustrated in the various figures and drawings.

DETAILED DESCRIPTION

For solving the defects mentioned in the prior art, the present invention discloses a volume adjusting method. In the disclosed volume adjusting method, while the user of the digital television switches from a first channel to a second channel according to a first command, the digital television tries adjusting the currently-used volume corresponding to the second channel according to a used volume, which is used at a last time when the second channel is switched to on the digital television. Moreover, the disclosed method also allows flexibility in instantly adjusting the currently-used volume corresponding to the second channel according to a decision of the user.

For clearly describing the volume adjusting method of the present invention, a volume plot of the second channel, i.e., the channel that the digital television is switched to, is used herein. Please refer to from FIG. 1 to FIG. 3, which are schematic volume plots for describing the volume adjusting method of the present invention. In the volume adjusting method of the present invention, a remembered volume of a previous channel, which is referred to as the abovementioned first channel, has to be compared with a remembered volume of a later channel, which is referred to as the abovementioned second channel and is used at a last time when the digital television is switched to the later channel, in advance, where the digital television is assumed to be switched from the previous channel to the later channel. Note that both the compared remembered volumes are recorded in respective volume settings of the pervious channel and the later channel, where the volume setting may also be recorded in a set top box of the digital television.

While the remembered volume of the previous channel is not equal to the remembered volume of the later channel, which is retrieved from the volume setting of the later channel, a currently-used volume of the later channel has to be adjusted according to the remembered volume of the later channel. Note that the remembered volume of the later channel used at the last time when the later channel is switched to may either be same with or different from the remembered volume of the previous channel. Moreover, when the remembered volume of the previous channel is equal to the remembered volume of the later channel used at the last time, the remembered volume of the later channel can be applied immediately without any change.

Note that for clearance of the following descriptions, the remembered volume of the previous channel is denoted as a first remembered volume, whereas the remembered volume of the later channel at the last time when the later channel is switched to is denoted as a second remembered volume.

Figure 1:
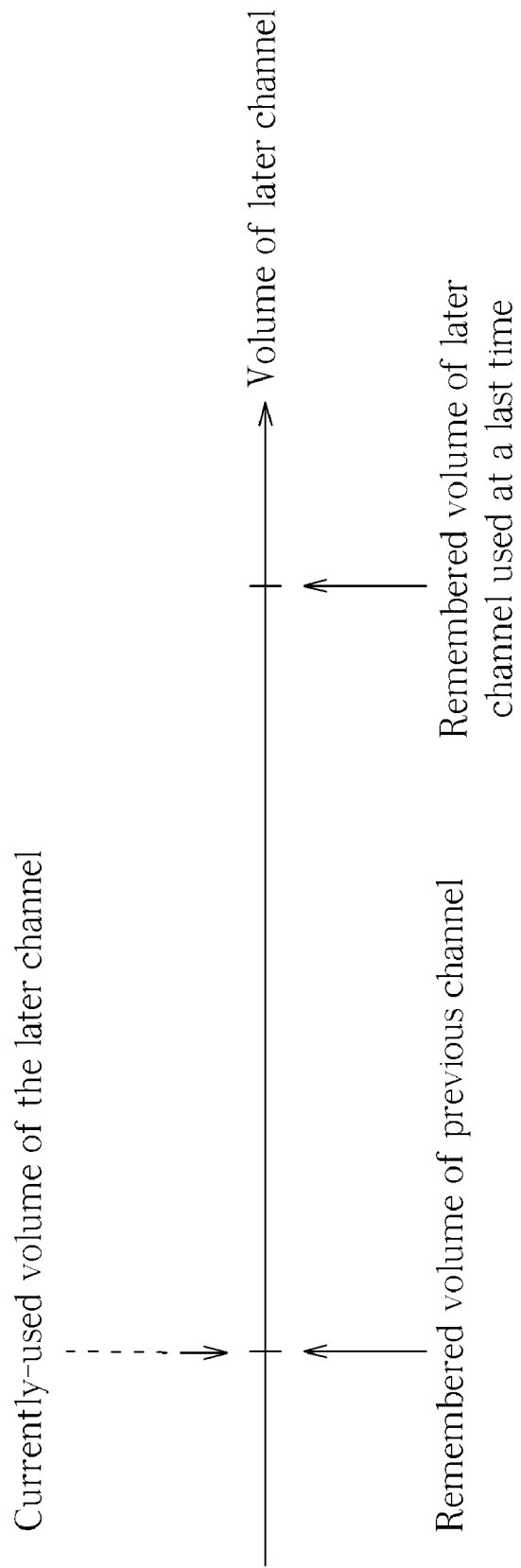
FIG. 1 illustrates a condition that a remembered volume of a previous channel is assumed not to be equal to a remembered volume of a later channel at the last time after comparison, where the remembered volume of the previous channel is lower than the remembered volume of the later channel.

FIG. 1 illustrates a condition that the first remembered volume of the previous channel is assumed not to be equal to the second remembered volume of the later channel at the last time after the comparison, where the first remembered volume of the previous channel is lower than said second remembered volume of the later channel. Under certain extreme cases, the second remembered volume of the later channel is much higher than the first remembered volume of the previous channel so that the volume difference between the first remembered volume and the second remembered volume may frighten the user of the digital television, as mentioned before. For preventing such a defect, a currently-used volume of the later channel is set to be the first remembered volume of the previous channel in advance, as shown in FIG. 1. Therefore, the user of the digital television may not be aware of the volume difference while the digital television is switched from the previous channel to the later channel.

Figure 2:
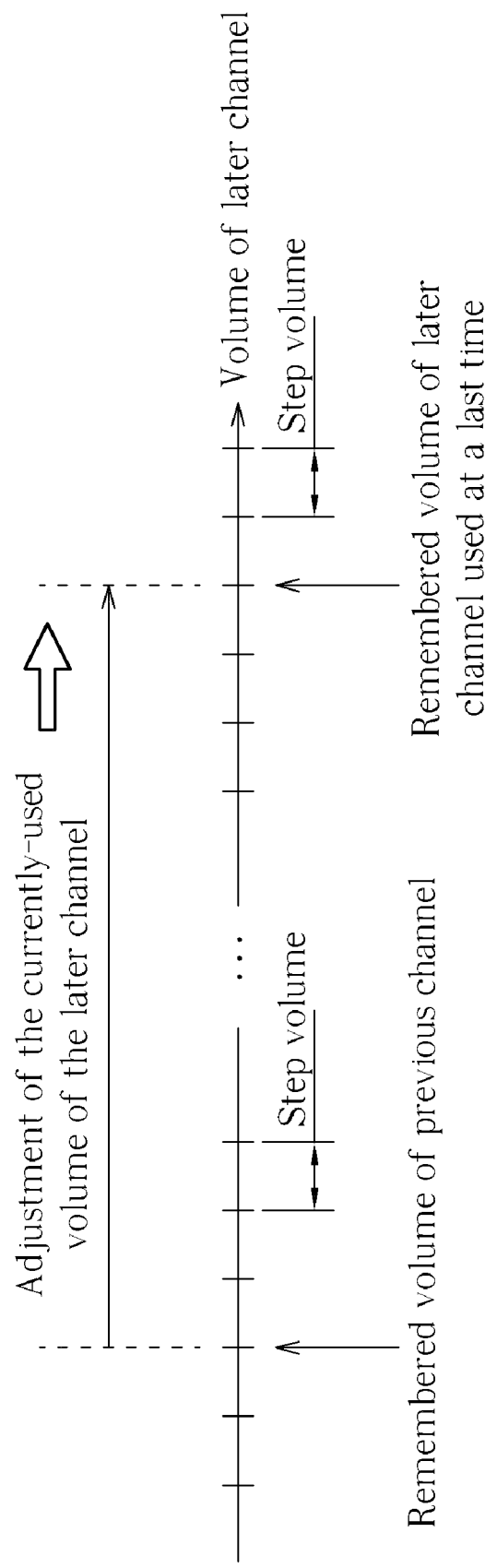
FIG. 2 illustrates the adjustment from the remembered volume of the previous channel to the remembered volume of the later channel by step volumes.
Figure 3:
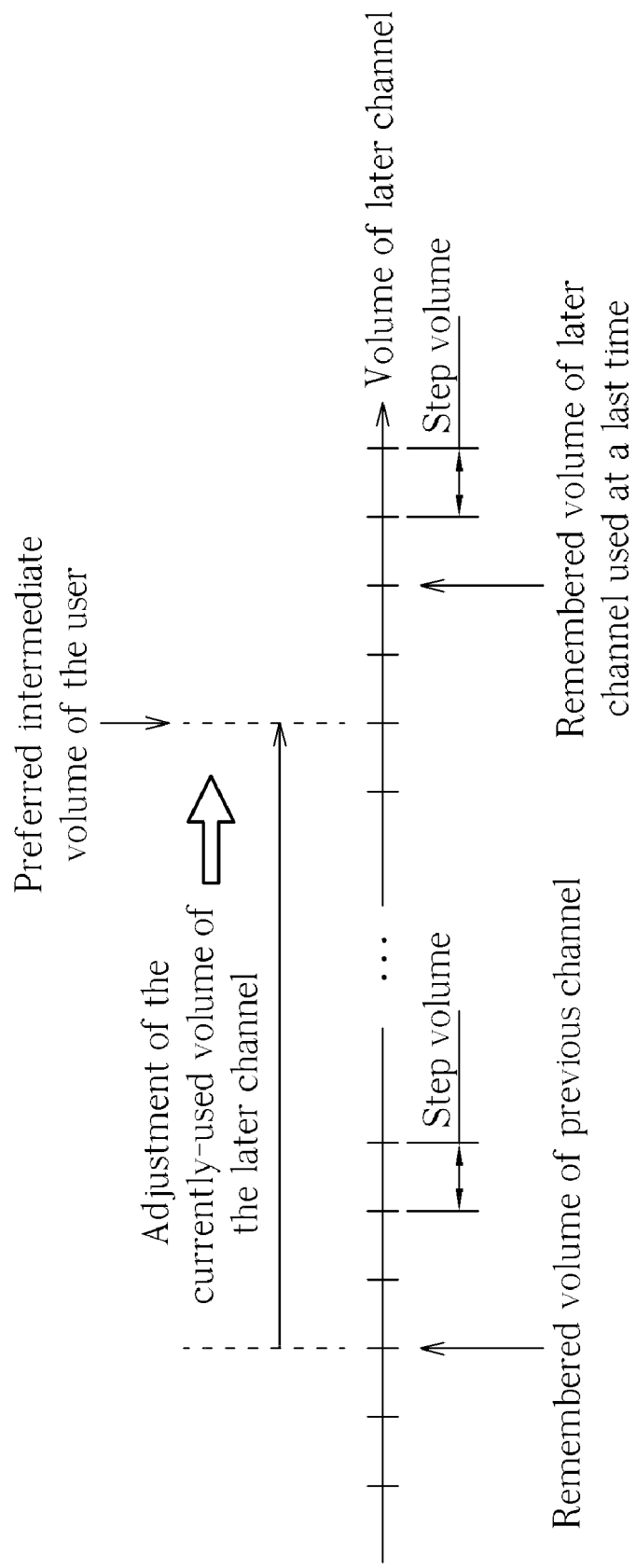
FIG. 3 illustrates a condition that the user of the digital television gives a volume setting command so that the incremental adjustment of the currently-used volume of the later channel is stopped when the user prefers an intermediate volume from the generated plurality of volumes.

Although the defect of the large volume difference is temporarily avoided, the currently-used volume of the later channel still has to be adjusted for reaching better and appropriate audio qualities of the later channel. FIG. 2 illustrates the adjustment from the first remembered volume of the previous channel to the second remembered volume of the later channel by step volumes. As shown in FIG. 2, a volume interval between the first remembered volume of the previous channel and the second volume of the later channel covers a plurality of volumes, which are generated according to a step volume used by the digital television and may be or may not be equally spaced by the step volume. The currently-used volume of the later channel may be adjusted iteratively, incrementally, and step volume by step volume, from the first volume and within the illustrated volume interval, on which the generated plurality of volumes are located at, i.e., said currently-used volume of the later channel is incremented by units of the step volume from the first remembered volume of the previous channel. Under a general case, the currently-used volume of the later channel may merely be incremented until meeting the second remembered volume of the later channel, as shown in FIG. 2. During the incremental adjustment, the incrementally-adjusted currently-used volume of the later channel, which may be anyone of the generated plurality of volumes, is compared with the second remembered volume of the later channel for determining whether the second remembered volume is met, i.e., while the currently-used volume of the later channel is adjusted to approach the second remembered volume of the later channel. When the second remembered volume is met according to the comparison, the incremental adjustment of the currently-used volume of the later channel may be stopped. Therefore, the currently-used volume of the later channel is smoothly adjusted to be the second remembered volume without bringing a significant and annoying volume for the user. However, in the volume adjusting method of the present invention, flexibility for the user of the digital television in choosing a preferred volume is reserved as well. For example, in FIG. 2, the incremental adjustment of the currently-used volume of the later channel may be stopped before meeting the second remembered volume when the user gives a volume setting command for assigning a preferred volume of the user. FIG. 3 illustrates a condition that the user of the digital television gives a volume setting command so that the incremental adjustment of the currently-used volume of the later channel is stopped when the user prefers an intermediate volume from the generated plurality of volumes. As shown in FIG. 3, the incremental adjustment is stopped before meeting the second remembered volume by a volume setting command given by the user since the user of the digital television may feel satisfied with a preferred intermediate volume from the generated plurality of volumes. Note that in other embodiments of the present invention, the volume setting command may also assign a preferred volume of the user other than the preferred volume shown in FIG. 3, even when the preferred volume of the user falls out of the interval between the first remembered volume of the previous channel and the second remembered volume of the later channel. Also note that the volume setting of the later channel has to be updated according to the preferred volume assigned by the user as well for the next time when the later channel is switched to on the digital television.

The user may flip between different channels of the digital television quickly so that the adjustment for a remembered volume of any channel switched to by the user may be in vain. For preventing the volume settings of different channels are disturbed by such flips, in the volume adjusting method of the present invention, if the user switches to still another channel other than the later channel before the currently used volume is adjusted to be equal to the second remembered volume, any adjustments of the currently-used volume after receiving the first command and before receiving the second command are abandoned so that no updates in the volume setting of the later channel are made, i.e., the currently used volume is restored back to be the first remembered volume. Thereby, volume settings of the digital television are not disturbed by flips of the user on different channels.

Though in the abovementioned embodiments of the present invention, the first remembered volume of the previous channel is lower than the second remembered volume of the later channel so that the incremental adjustment of the currently-used volume of the later channel is required, however, decremental adjustment of the currently-used volume of the later channel is also required when the first remembered volume of the previous channel is higher, especially when much higher, than the second remembered volume of the later channel. The decremental adjustment of the currently-used volume of the later channel may be easily inducted according to the above diagrams shown in FIG. 1, FIG. 2, and FIG. 3 so that details of the decremental adjustment are not particularly described for brevity.

Figure 4:
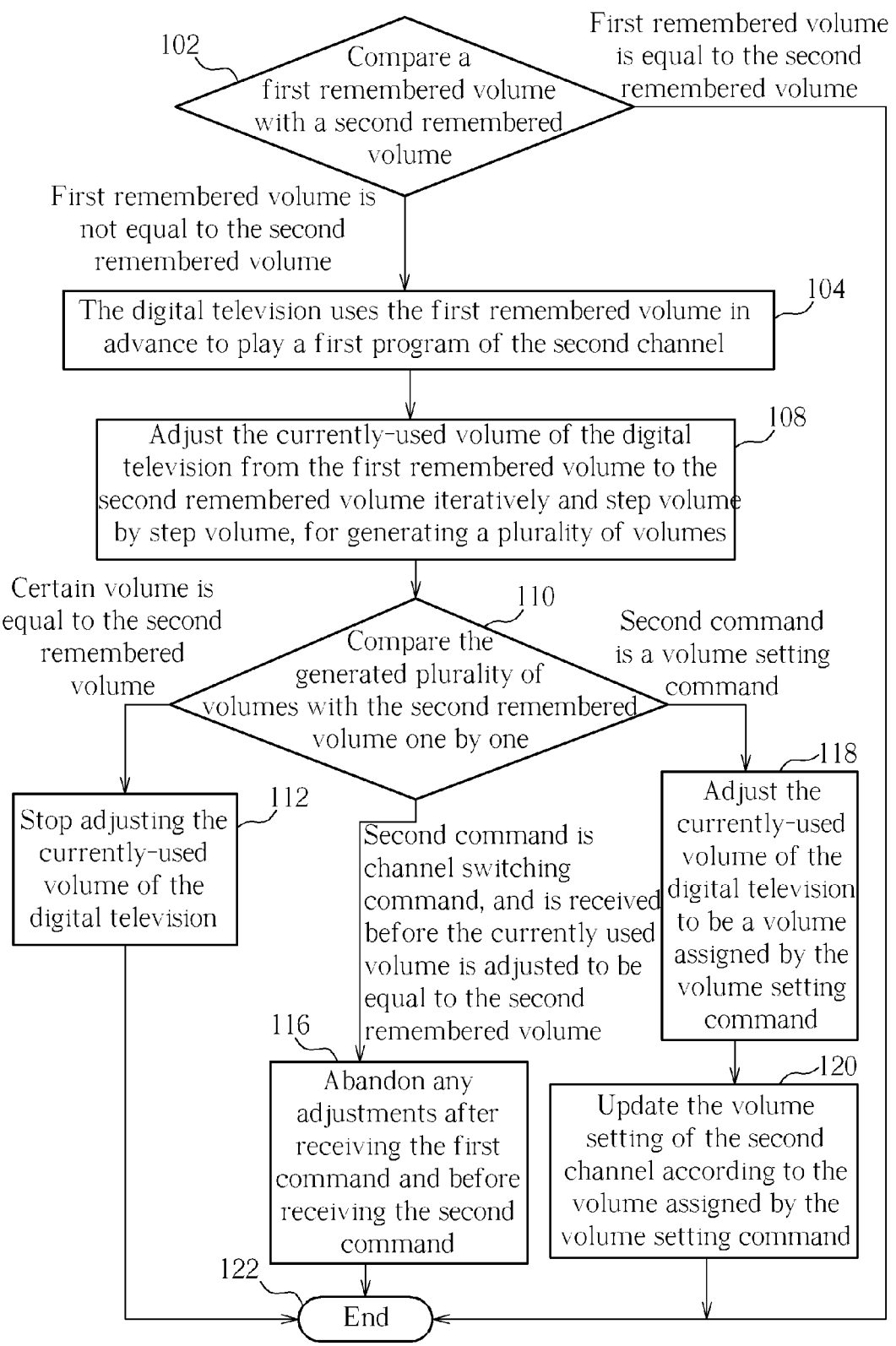
FIG. 4 is a flowchart of the volume adjusting method of the present invention.

Please refer to FIG. 4, which is a flowchart of the volume adjusting method of the present invention. As shown in FIG. 4, the volume adjusting method includes steps as follows:

Step 102: Compare a first remembered volume used for a first channel with a second remembered volume used for a second channel, while a digital television receives a first command for switching from the first channel to the second channel; while the first remembered volume is not equal to the second remembered volume, go to Step 104; else, go to Step 122;

Step 104: The digital television uses the first remembered volume in advance to play a first program of the second channel, and go to Step 108;

Step 108: Adjust the currently-used volume of the digital television from the first remembered volume to the second remembered volume iteratively and step volume by step volume, for generating a plurality of volumes, and go to Step 110;

Step 110: Compare the generated plurality of volumes with the second remembered volume one by one; while a certain volume of the plurality of volumes is equal to the second remembered volume after the comparison, go to Step 112; when a second command is received before the currently used volume is adjusted to be equal to the second remembered volume, and when the second command is a channel switching command, go to Step 116; and when the second command is received and is a volume setting command, go to Step 118;

Step 112: Stop adjusting the currently-used volume of the digital television, and go to Step 122;

Step 116: Abandon any adjustments after receiving the first command and before receiving the second command, and go to Step 122;

Step 118: Adjust the currently-used volume of the digital television to be a volume assigned by a volume setting command, and go to Step 120;

Step 120: Update the volume setting of the second channel according to the volume assigned by the volume setting command, and go to Step 122; and Step 122: End.

FIG. 4 also illustrates a summary of descriptions related to FIG. 1, FIG. 2, and FIG. 3. However, combinations or permutations of steps shown in FIG. 4 should be regarded to indicate other embodiments of the present invention.

The present invention discloses a volume adjusting method. With the aid of the disclosed volume adjusting method, complicated calculations for a gain to adjust the currently-used volume of any channel of the digital television are avoided, and a volume difference between different channels may also be prevented from annoying the user of the digital television. In the disclosed method of the present invention, a comparison between a first remembered volume of a previous channel and a second remembered volume of a later channel is provided. According to the result of the comparison, a currently-used volume of the later channel may be adjusted from the first remembered volume to the second remembered volume iteratively and by step volumes so that the adjustment of the currently-used volume of the later channel is not annoying for the user. Moreover, the disclosed method of the present invention also allows the user in determining a preferred volume to be the currently-used volume of the later channel. While the user of the digital television flips between channels, unnecessary updates in a volume setting of the later channel are abandoned.

Those skilled in the art will readily observe that numerous modifications and alterations of the device and method may be made while retaining the teachings of the invention.

What is claimed is:

1. A volume adjusting method for channel switching of a digital television, comprising:

comparing a first remembered volume used for a first channel with a second remembered volume used for a second channel, while a digital television receives a first command for switching from the first channel to the second channel;

the digital television using the first remembered volume in advance to play a first program of the second channel, while the first remembered volume is not equal to the second remembered volume;

adjusting a currently-used volume of the digital television from the first remembered volume to the second remembered volume iteratively and step volume by step volume, for generating a plurality of volumes; and comparing the generated plurality of volumes with the second remembered volume one by one; wherein the second remembered volume is a volume used at a last time when the digital television plays a second program of the second channel; and wherein the second remembered volume is recorded in a volume setting of the second channel.

2. The method of claim 1 wherein comparing the generated plurality of volumes with the second remembered volume one by one comprises:

stopping adjusting the currently-used volume of the digital television while a certain volume of the plurality of volumes is equal to the second remembered volume.

3. The method of claim 1 wherein comparing the generated plurality of volumes with the second remembered volume one by one comprises:

stopping adjusting the currently-used volume of the digital television while a second command is received.

4. The method of claim 3 wherein stopping adjusting the currently-used volume of the digital television while the second command is received comprises:

abandoning any adjustments after receiving the first command and before receiving the second command, when the second command is a channel switching command.

5. The method of claim 3 wherein stopping adjusting the currently-used volume of the digital television while the second command is received comprises:

adjusting the currently-used volume of the digital television to be a volume assigned by a volume setting command when the second command is the volume setting command; and updating the volume setting of the second channel according to the volume assigned by the volume setting command.

6. The method of claim 1 wherein adjusting the currently-used volume of the digital television from the first remembered volume to the second remembered volume iteratively and step volume by step volume for generating the plurality of volumes comprises:

incrementing the currently-used volume of the digital television step volume by step volume from the first remembered volume to the second remembered volume for generating the plurality of volumes, while the second remembered volume is higher than the first remembered volume.

7. The method of claim 1 wherein adjusting the currently-used volume of the digital television from the first remembered volume to the second remembered volume iteratively and step volume by step volume for generating the plurality of volumes comprises:
    decrementing the currently-used volume of the digital television step volume by step volume from the first remembered volume to the second remembered volume for generating the plurality of volumes, while the second remembered volume is lower than the first remembered volume.

* * * * *